United States Patent [19]

Tawada

[11] Patent Number: 5,404,312
[45] Date of Patent: Apr. 4, 1995

[54] AUTOMATIC DESIGNING SYSTEM CAPABLE OF DESIGNING A LOGIC CIRCUIT AS DESIRED

[75] Inventor: Shigeyoshi Tawada, Tokyo, Japan

[73] Assignee: NEC Corporation, Tokyo, Japan

[21] Appl. No.: 863,772

[22] Filed: Apr. 6, 1992

[30] Foreign Application Priority Data

Apr. 4, 1991 [JP] Japan .................. 3-097939

[51] Int. Cl.6 ............................................. G06F 15/60
[52] U.S. Cl. ................................ 364/491; 364/490;
364/489; 364/488
[58] Field of Search ................ 364/488, 489, 490, 491

[56] References Cited

U.S. PATENT DOCUMENTS

| | | | |
|---|---|---|---|
| 5,038,294 | 8/1991 | Arakawa et al. | 364/491 |
| 5,046,017 | 9/1991 | Yuyama et al. | 364/491 |
| 5,197,015 | 3/1993 | Hartoog et al. | 364/490 |
| 5,231,590 | 7/1993 | Kumar et al. | 364/491 |
| 5,237,514 | 8/1993 | Curtin | 364/490 |
| 5,249,133 | 9/1993 | Batra | 364/489 |
| 5,249,134 | 9/1993 | Oka | 364/491 |

OTHER PUBLICATIONS

"A Block Interconnection Algorithm for Hierarchical Layout System" by Fukui et al., IEEE Trans. on Computer–Aided–Design, vol. CAD-6, No. 3, May 1987, pp. 383–390.

"A Hierarchical Routing System for VLSIs Including Large Macros" by Hiwatashi et al., IEEE 1986 Custom Integrated Circuits Conf., pp. 285–288.

"Timing Influence Layout Design" by Burstein et al., IEEE 22nd Design Automation Conf., 1985, pp. 124–130.

"Timing Analysis for NMOS VLSI" by Jouppi, IEEE 20th Design Automation Conf., 1983, pp. 411–418.

Primary Examiner—Vincent N. Trans
Attorney, Agent, or Firm—Foley & Lardner

[57] ABSTRACT

In a computer aided design system for designing a logic circuit including a plurality of functional blocks connected through path nets to determine a final routing layout under a circuit constraint from an initial routing layout. A path length is determined in relation to a routing path of the initial routing layout. A limiting path length is also determined in relation to the routing path in consideration of a predetermined delay time determined by the circuit constraint. The initial routing layout is successively renewed into the final routing layout in accordance with the path length and the limiting length until the circuit constraint is satisfied.

2 Claims, 4 Drawing Sheets

AUTOMATIC DESIGNING SYSTEM CAPABLE OF DESIGNING A LOGIC CIRCUIT AS DESIRED

BACKGROUND OF THE INVENTION

This invention relates to a computer aided design system for designing a logic circuit including a plurality of functional blocks connected through path nets to one another. More particularly, this invention relates to a designing system for designing a final routing layout in response to logic connection information indicative of a connection between the functional blocks under a circuit constraint or limitation imposed on the path nets.

On designing a logic circuit comprising a plurality of functional blocks each of which may be formed by a gate, a flip-flop, or the like, it is preferable to connect the functional blocks to one another in accordance with logic connection information through final routing paths which form the final routing layout. The logic connection information is representative of the path nets between the functional blocks. Thus, the logic circuit is logically designed which is composed of the functional blocks and the final routing layout. The logic circuit may be actually formed or fabricated by a large-scale integrated circuit, a printed-circuit board, or the like after it is designed in the above-mentioned manner.

In a conventional computer aided design system, an initial routing layout which is empirically determined is first given in the form of the logic connection information to the system. The initial routing layout is assumed to be given as optimum courses of the path nets between the functional blocks. Thereafter, the initial routing layout is successively renewed under the circuit constraint until the final routing layout is obtained. The circuit constraint may be specified by a predetermined limiting value which is indicative of a maximum length uniformly determined at each of the path nets. The delay time of each of the path nets is long, as the limiting value is large.

However, consideration is not made about the delay time on renewing the initial routing layout into the final routing layout in the conventional computer aided design system. When the final routing layout is obtained, the actual delay time is often more than an allowed delay time in one path net because the limiting value is uniformly determined at each of the path nets. Any adverse influence might not occur due to the delay time when the limiting value selected is so small. It is difficult to renew the initial routing layout into the final routing layout as desired because the limiting value is small. To the contrary, when the limiting value is selected large, renewal of the initial routing layout can be achieved to obtain the final routing layout as desired. It is difficult to neglect influences of the delay times. The delay times and the limiting value have an antinomic relationship.

SUMMARY OF THE INVENTION

It is an object of this invention to provide a design system capable of preferably renewing an initial routing layout into a final routing layout as desired.

It is another object of this invention to provide a design system capable of neglecting a delay time which is determined for a logic circuit.

Other objects of this invention will become clear as the description proceeds.

According to this invention, there is provided a design system for designing a logic circuit comprising a plurality of functional blocks connected through path nets to determine a final routing layout in response to logic connection information under a circuit constraint. The logic connection information indicates connections between the functional blocks. The design system comprises first determining means for determining an initial routing layout having at least one routing path formed by the path nets in accordance with the logic connection information, second determining means for determining a path length at each of the routing path on the basis of the initial routing layout, and third determining means for determining a limiting length at each of the routing paths in accordance with a predetermined delay time which is determined by the circuit constraint. The limiting length is representative of a length allowed at each of the routing paths. The design system further comprises renewing means for renewing the initial routing layout into the final routing layout in accordance with the path length and the limiting length until the circuit constraint is satisfied.

DESCRIPTION OF THE PREFERRED EMBODIMENTS

Figure 1:
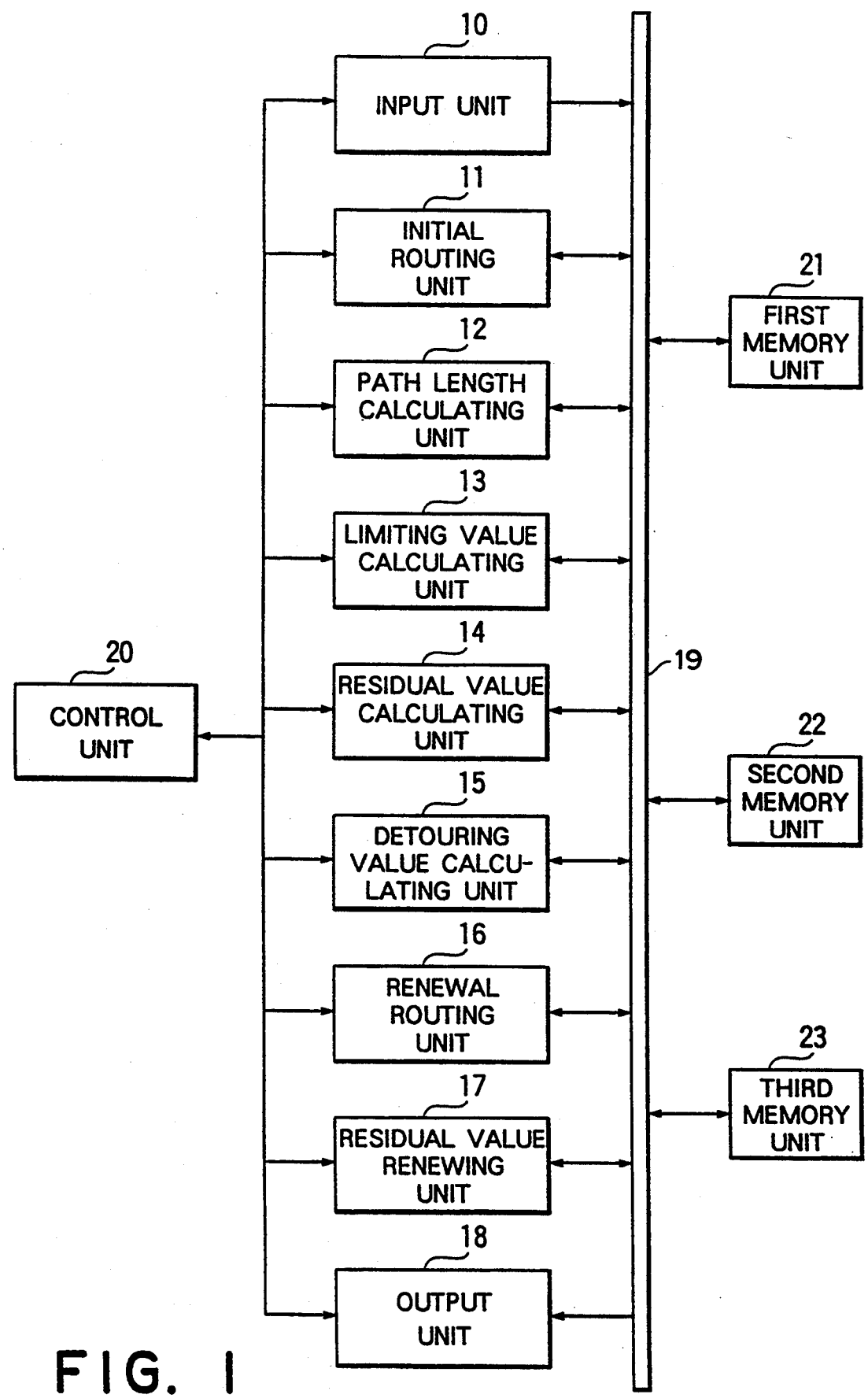
FIG. 1 is a block diagram of a computer aided design system according to an embodiment of this invention.

FIG. 1 is a computer aided design system according to a preferred embodiment of this invention. It is for use in designing a logic circuit comprising a plurality of functional blocks connected through path nets to one another. More particularly, the computer aided design system is operable to design a final routing layout under a circuit constraint or limitation imposed on the path nets in response to logic connection information indicative of a connection between the functional blocks. The computer aided design system comprises an input unit 10, an initial routing or wiring unit 11, a path length calculating unit 12, a limiting value calculating unit 13, a residual value calculating unit 14, a detouring value calculating unit 15, a renewal routing unit 16, a residual value renewing unit 17, and an output unit 18, all of which are connected to a bus line 19 and are controlled by a control unit 20. Furthermore, first through third memory units 21 to 23 are connected to the bus line 19.

The input unit 10 is supplied from an external device (not shown) with the logic connection information and circuit constraint information which is representative of the circuit constraint. The first memory unit 21 is loaded from the input unit 10 through the bus line 19 with the logic connection information and the circuit constraint information. Thus, the logic connection information and the circuit constraint information are stored in the first memory unit 21.

The circuit constraint information comprises location information representative of each location of the functional blocks on a substantially plane area. The circuit constraint information further comprises a delay limiting value of each of paths or routing paths, a block delay value of each of the functional blocks, a unit delay value, and physical terminal information representative of the location of terminals of each functional block. The delay limiting value and the unit delay value will be described hereinafter.

Figure 2:
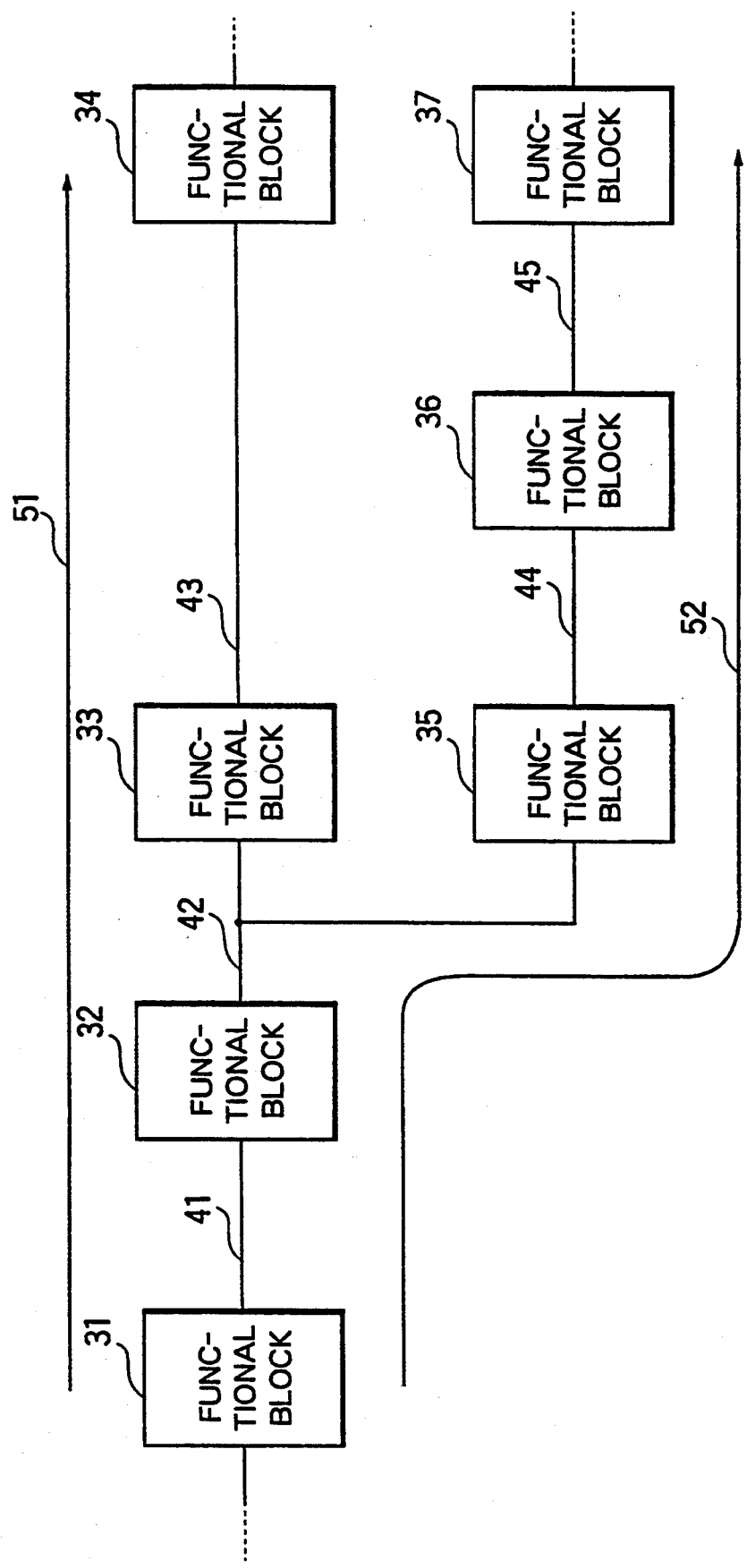
FIG. 2 is a diagram for illustrating an example of connection between a plurality of functional blocks.

Referring to FIG. 2, it is assumed that first through seventh functional blocks 31 to 37 are logically placed on the substantially plane area on the basis of the location information and that the first through the seventh functional blocks 31 to 37 are connected through first through fifth path nets 41 to 45 to one another on the basis of the logic connection information. In this case, it is noted that a first path 51 is defined as a path for connecting the first through the fourth functional blocks 31 to 34 through first through third path nets 41 to 43. Furthermore, it is noted that a second path 52 is defined as a path for connecting the first and the second functional blocks 31 and 32 and the fifth through the seventh functional blocks 35 to 47 through the first, second, fourth, and fifth path nets 41, 42, 44 and 45.

Figure 3:
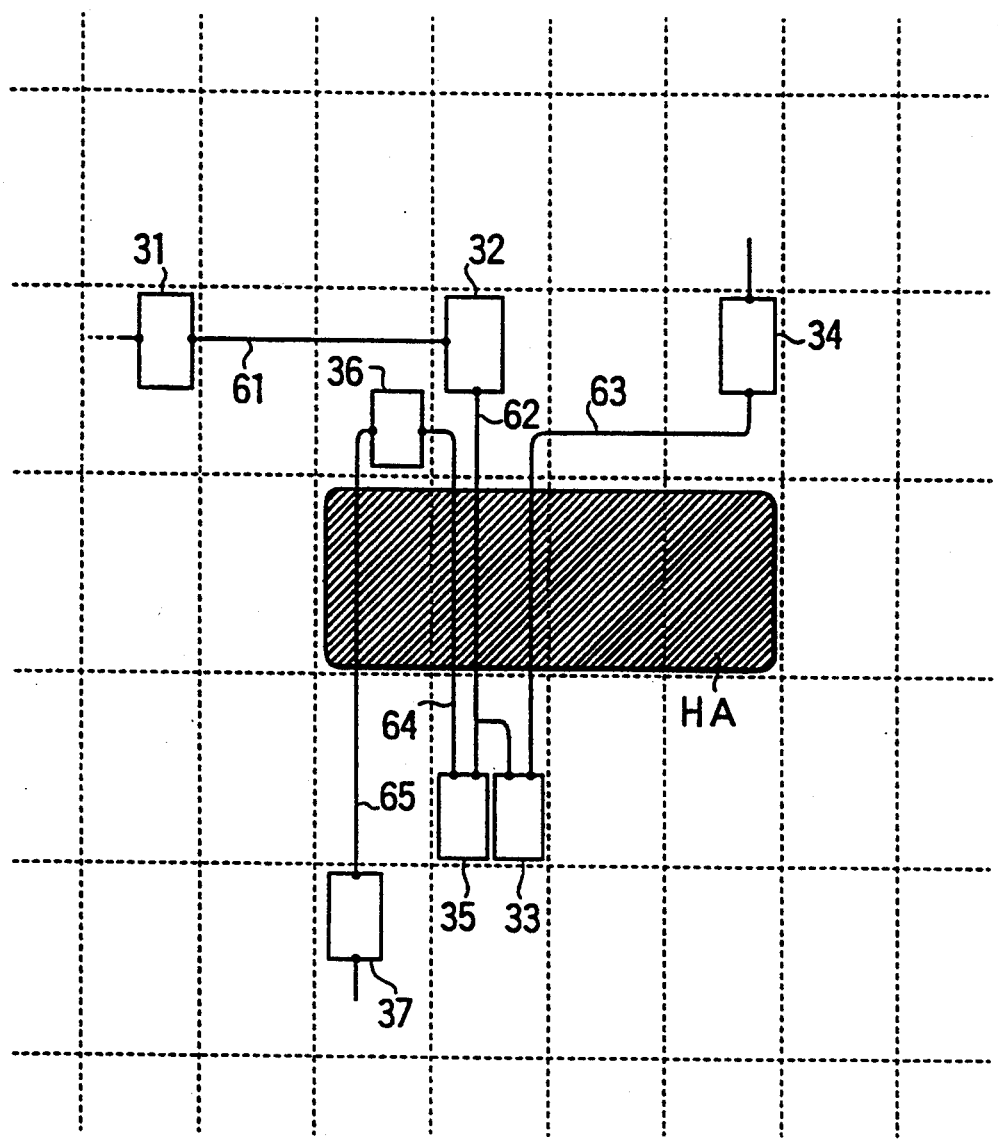
FIG. 3 is a diagram for illustrating an initial routing layout.

Referring to FIGS. 1 and 3, description will be made about an operation of the computer aided design system illustrated in FIG. 1 on designing a logic circuit shown in FIG. 2. In this case, the first through the seventh blocks 31 to 37 are assumed to be actually positioned on the plane in a manner illustrated in FIG. 3. The initial routing unit 11 coarsely determines an initial routing layout in accordance with the location information, the physical terminal information, and the logic connection information. More particularly, the initial routing unit 11 determines the initial routing layout in a known manner of, for example, by the Steiner tree technique, on the basis of the location information, the physical terminal information, and the logic connection information. The initial routing layout thus determined may be given as optimum or shortest courses 61 to 65 of the path nets 41 to 45 among the functional blocks 31 to 37. The initial routing layout is sent from the initial routing unit 11 to the third memory unit 33 to be stored as initial routing layout information in the third memory unit 33. Although only the optimum courses 61 to 65 are shown in FIG. 3, other optimum courses, which correspond to other path nets, may exist on the substantially plane area.

In FIG. 3, it is assumed that a great number of optimum courses are present on a hatched area labelled HA. In this case, it is necessary to make some optimum courses detour from the hatched area HA in order to effectively form final courses. Such a hatched area HA may be considered as a jam-packed or congested area of wirings and will be called a jam-packed area hereinunder.

Accordingly, it is preferable that the final layout of courses or wirings prevents intersection of routes or courses with the jam-packed area. Taking this into consideration, a detour or a by-pass route is determined in a conventional computer aided design system, with any delay time of the detour route left out of consideration.

Herein, it has been found out that a limit delay time for each detour route should be determined, and, otherwise, a desired circuit characteristic can not be accomplished due to such a delay time.

Turning back to FIG. 1, the path length calculating unit 12 calculates lengths of the first and the second paths to obtain first and second path lengths under control of the control unit 20. For example, when the lengths of optimum courses 61 to 65 are equal to 2, 4, 6, 3, 4 unit lengths, respectively, first and the second path lengths 51 and 52 are equal to 12 and 13 unit lengths, respectively.

After obtaining the first and the second path lengths 51 and 52, the control unit 20 controls the limiting value calculating unit 13 to obtain path length limiting values of the first and the second paths 51 and 52 as first and second path length limiting values, respectively. The limiting value calculating unit 13 calculates the first and the second path length limiting values on the basis of the logic connection information, the delay limiting value, the block delay value, the unit delay value. When each of the first and the second path length limiting values is represented by TL, each of the first and the second path length limiting values is given by:

$$TL = (t1 - \Sigma tk)/t2, \quad (1)$$

where t1 represents the delay limiting value, tk represents the block delay value of one of the functional blocks 31 to 37, and t2 represents unit delay value.

The control unit 20 controls the residual value calculating unit 14 to obtain first and second difference values. The first difference value is representative of a difference between the first path length and the first path length limiting value. Similarly, the second difference value is representative of a difference between the second path length and the second path length limiting value. The residual value calculating unit 14 delivers the first and the second difference values to the second memory unit 22 to store the first and the second difference values to the second memory unit 22.

The control unit 20 controls the detouring value calculating unit 15 to obtain a detouring limiting value in concern with each of the path nets, that is, first through fifth courses 41 to 45 as first through fifth detouring limiting values, respectively.

Referring to FIG. 1 in addition to FIGS. 2 and 3, the detouring value calculating unit 15 first calculates the first detouring limiting value in connection with the first path net 41. The first path net 41 belongs to the first and the second paths 51 and 52. The detouring value calculating unit 15 compares the first difference value with the second difference value. When the first difference value is less than the second difference value, the detouring value calculating unit 15 determines the first difference value as the first detouring limiting value. When the second difference value is less than the first difference value, the detouring value calculating unit 15 determines the second difference value as the first detouring limiting value.

Similarly, the second path net 42 belongs to the first and the second paths 51 and 52. Therefore, the detouring value calculating unit 15 determines the lesser of the first and the second difference values as the second detouring limiting value. Inasmuch as the first path net 43 belongs only to the first path, the detouring value calculating unit 15 determines the first difference value as the third detouring limiting value. The fourth and the fifth path nets 44 and 45 belong only to the second path 52. Therefore, the detouring value calculating unit 15 determines the second difference value as the fourth and the fifth detouring limiting values.

Figure 4:
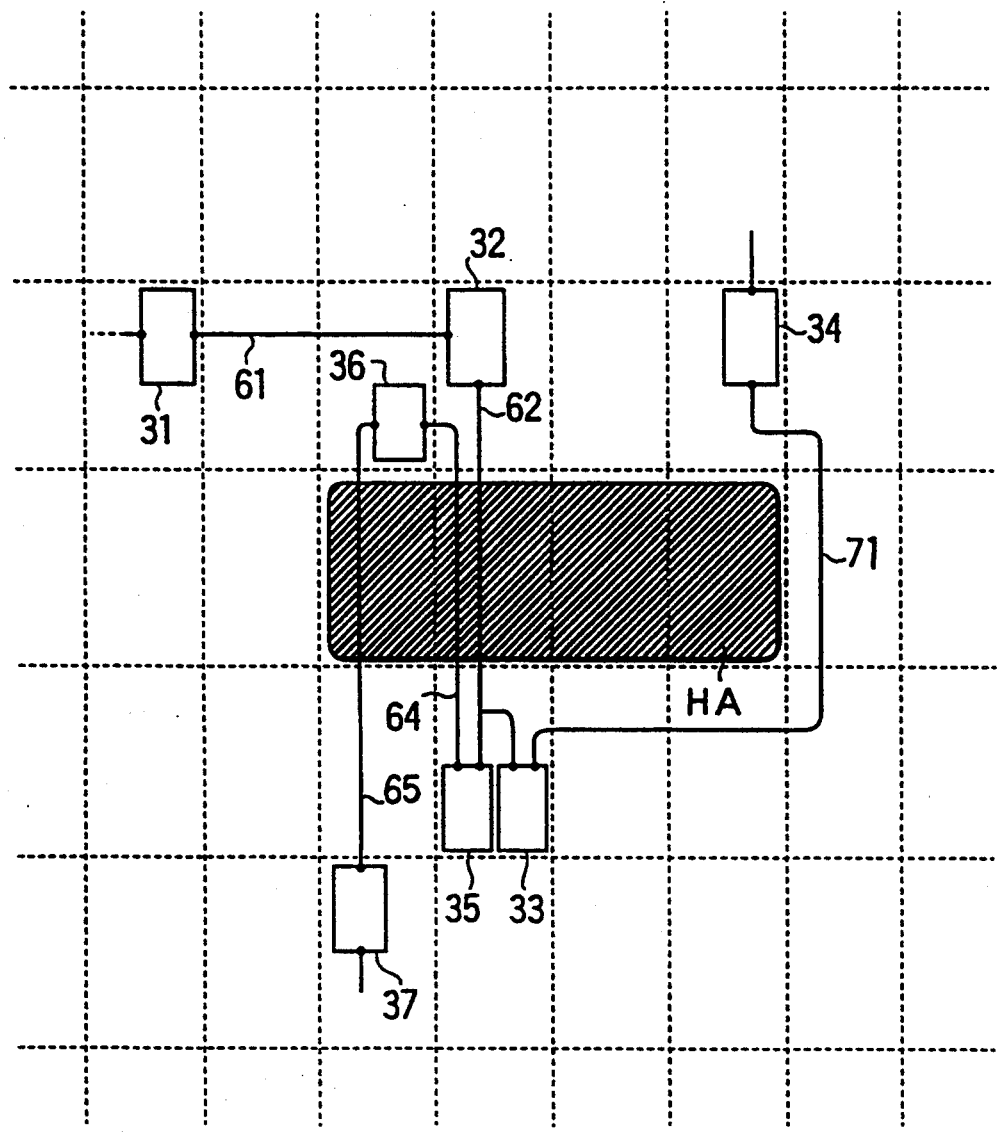
FIG. 4 is a diagram for illustrating a final routing layout renewed by the computer aided design system illustrated in FIG. 1.

Referring to FIG. 4 together with FIGS. 1 and 3, the control unit 20 controls the renewal routing unit 16 to obtain a first renewal routing layout when the difference value as mentioned above is given to each of path nets 41 to 45 (FIG. 2). The renewal routing unit 16 investigates whether or not each of optimum courses 61 to 65 is renewed into a renewal course. More particularly, investigation is made by the renewal routing unit 16 as regards renewal of the optimum courses 62 to 65 on the hatched area HA. When no renewal is required for each of the optimum courses 62 to 65 on the hatched area HA, the renewal routing unit 16 determines the initial routing layout as a final routing layout.

When a renewal is required for at least one of the optimum courses 62 to 65 on the hatched area HA, the renewal routing unit 16 selects one of the optimum courses 62 to 65 on the hatched area HA that is to be renewed. For example, let the renewal routing unit 16 select the third optimum course 63 to renew the fifth optimum course 63 (FIG. 3). In the example being illustrated, the third optimum course 63 detoured or renewed into a first renewal course 71 in accordance with the third detouring limiting value in order to obtain a first renewal routing layout. When the third optimum course 63 (FIG. 3) is desirably renewed into the first renewal course 71 as shown in FIG. 4, the renewal routing unit 16 calculates course lengths of the third optimum course 63 and the first renewal course 71 as a previous length and a next length, respectively. Furthermore, the renewal routing unit 16 calculates a first renewal difference between the previous length and the next length. The renewal routing unit 16 supplies the first renewal routing layout to the third memory unit 23 to store the first renewal routing layout in the third memory unit 23.

Thereafter, the renewal routing unit 16 investigates whether the first renewal course 71 belongs to the first or the second paths 51 and 52 to obtain attribute information representative of the path or paths including the first renewal course 71. The renewal routing unit 16 delivers the first renewal difference and the attribute information to the control unit 20.

Supplied with the first renewal difference and the attribute information, the control unit 20 gives the residual value renewal unit 17 the first renewal difference and the attribute information. Responsive to the first renewal difference and the attribute information, the residual value renewal unit 17 reads the third difference out of the second memory unit 22 and calculates a first improved difference between the third difference and the first renewal difference to detect a space or room left on the plane. The residual value renewal unit 17 stores the first improved difference in the second memory unit 22.

The control unit 20 controls the detouring value calculating unit 15 to obtain a first improved detouring limiting value in accordance with the first improved difference. More particularly, the detouring value calculating unit 15 reads the first improved difference out of the second memory unit 22 and determines the first improved difference as the first improved detouring limiting value inasmuch as the renewal course 71 belongs to only the first path 51.

Thereafter, the control unit 20 controls the renewal routing unit 16 to investigate whether or not a second one of the optimum courses is to be renewed into a second renewal course. When the renewal is necessary, operation is carried out in a similar manner described above. In FIG. 4, none of the second or fourth, and fifth optimum courses 62, 64, and 65 can be renewed into a second renewal course because the second, the fourth, and the fifth detouring limiting values are very small. When the renewal operation comes to an end, the second renewal routing layout is determined as the final routing layout. Otherwise, when the renewal operation is not needed after obtaining the first routing layout, the renewal routing unit 16 determines the first renewal routing layout as the final routing layout.

What is claimed is:

1. An automatic designing system for designing a logic circuit comprising a plurality of functional blocks connected to one another through path nets, said automatic designing system determining a final routing layout in response to logic connection information including a circuit constraint, said logic connection information indicating connections between said functional blocks, said automatic designing system comprising:

first determining means for determining an initial routing layout having at least one routing path formed by said path nets in accordance with said logic connection information;

second determining means for determining a path length of each of said routing paths based on said initial routing layout;

third determining means for determining a limiting length of each of said routing paths in accordance with a predetermined delay time which is determined by said circuit constraint, said limiting length being representative of a length allowed for each of said routing paths;

fourth determining means for determining a difference value representative of a difference between said limiting length and said path length for each of said routing paths;

selecting means for selecting the smallest value among a plurality of difference values as a selected value for each of said path nets;

improving means for improving said initial routing layout into a primary routing layout in accordance with said selected value;

renewing means for renewing said difference value into a renewal difference value on the basis of said initial routing layout and said primary routing layout; and replacing means for replacing said difference value by said renewal difference value to determine said final routing layout.

2. An automatic designing system as claimed in claim 1, wherein said automatic designing system further comprises:

memory means for memorizing said logic connection information and circuit constraint information representative of said circuit constraint, said circuit constraint information comprising said predetermined delay time which includes a block delay time of each of said functional blocks, a delay limiting value representative of a delay time of each of said routing paths, and a unit delay time representative of delay time of each of said routing paths at a unit length.

* * * * *